United States Patent
Satoh et al.

(10) Patent No.: US 6,472,692 B1
(45) Date of Patent: Oct. 29, 2002

(54) SEMICONDUCTOR DEVICE

(75) Inventors: Katsumi Satoh; Kazuhiro Morishita; Shinji Koga, all of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/566,737

(22) Filed: May 9, 2000

Related U.S. Application Data

(63) Continuation of application No. PCT/JP98/04058, filed on Sep. 10, 1998.

(51) Int. Cl.⁷ ............................ H01L 29/74; H01L 29/00
(52) U.S. Cl. ........................ 257/138; 257/137; 257/131
(58) Field of Search ................................ 257/107, 119, 257/135–8, 144, 147, 152, 163, 170, 131

(56) References Cited

U.S. PATENT DOCUMENTS

| | | | |
|---|---|---|---|
| 5,250,446 A | * 10/1993 | Osawa et al. | 437/24 |
| 5,883,403 A | * 3/1999 | Ishikawa et al. | |
| 6,100,575 A | * 8/2000 | Minato | 257/617 |
| 6,163,040 A | * 12/2000 | Akiyama et al. | 257/131 |
| 6,236,069 B1 | * 5/2001 | Shinohe et al. | 257/138 |
| 6,252,259 B1 | * 6/2001 | Minato | 257/138 |
| 6,274,892 B1 | * 8/2001 | Kub et al. | 257/131 |
| 6,313,485 B1 | * 11/2001 | Tihanyi | 257/140 |

FOREIGN PATENT DOCUMENTS

| | | | |
|---|---|---|---|
| EP | 0-651-446 A2 | * 5/1995 | H01L/29/74 |
| EP | 0-685-889 A3 | * 4/1996 | H01L/29/744 |
| JP | 48-21198 | 6/1973 | |
| JP | 64-9658 | 1/1989 | |
| JP | 8-102545 | 4/1996 | |
| JP | 09260640 A | * 10/1997 | H01L/29/744 |
| JP | 10-74959 | 3/1998 | |

OTHER PUBLICATIONS

International Search Report.

* cited by examiner

*Primary Examiner*—Nathan J. Flynn
*Assistant Examiner*—Johannes Mondt
(74) *Attorney, Agent, or Firm*—Oblon, Spivak, McClelland, Maier & Neustadt, P.C.

(57) ABSTRACT

To suppress spike voltage generated at turn-off operation, a semiconductor device according to the invention comprises a first region composed of a first conductor, a second region composed of a second conductor formed on top of the first region, a third region composed of the first conductor formed on top of the second region and a fourth region composed of the second conductor formed on top of the third region. The second region is comprised of a depletion-layer forming auxiliary layer having a short lifetime and formed in the vicinity of the third region, a tail-current suppression layer having a shorter lifetime than that of the depletion-layer forming auxiliary layer and formed in the vicinity of the first region and a depletion-layer forming suppression layer having a longer lifetime than that of the depletion-layer forming auxiliary layer and formed between the depletion-layer forming auxiliary layer and the tail-current suppression layer.

11 Claims, 6 Drawing Sheets

SEMICONDUCTOR DEVICE

CROSS-REFERENCE TO THE RELATED APPLICATION

This application is a continuation of International Application No. PCT/JP98/04058, whose international filing date is Sep. 10, 1998, the disclosure of which Application is incorporated by reference herein.

TECHNICAL FIELD

The present invention relates to a semiconductor device with four-layer structure (PNPN structure) such as thyristor.

BACKGROUND ART

Semiconductor devices for a large amount of electric power have been improved to deal with a high pressure and a large amount of current. A gate commutation thyristor element (hereinafter referred to as GCT element), for example, allows now a maximum current of 4000A driven by DC3000V to flow without any snubber circuit.

FIG. 6 is a diagram showing a basic circuit applicable to a GCT element in the case that a snubber circuit is added. FIG. 7 is a diagram showing a basic circuit applicable to a GCT element in the case that any snubber circuit is not added. In FIG. 6, reference numeral 101 is a GCT element that is connected in series to a power source and to a circuit where a load and a free wheel diode are connected in parallel. Numeral 102 is a snubber circuit, comprising a capacitor, a diode and a resistor, which is connected between the anode and the cathode of the GCT element 101. In FIG. 7, numeral 103 is a voltage clamping circuit, comprising a diode and a capacitor, which is connected between the anode and the cathode of the GCT element 101. Numeral 104 is a resistor connected between the power source and a terminal located between the diode and the capacitor in the voltage clamping circuit 103. The remaining elements in FIG. 7 are the same as FIG. 6, except the snubber circuit 102. Therefore, a further description is omitted herein.

As shown in FIG. 6, in a turn-off operation where the snubber circuit 102 is added, after starting the turn-off operation, the GCT element 101 begins to restore its voltage blocking characteristic, and begins to block the voltage. Simultaneously, a current begins to flow in the snubber circuit 102 that is connected in parallel with the GCT element 101. In this manner, it is possible to cause the current that has been flowing in the GCT element 101 to flow in the snubber circuit 102 and to reduce the current in the GCT element 101. As a result, a turn-off operation with a small amount of turn-off loss can be performed.

On the other hand, in a turn-off operation shown in FIG. 7 where the snubber circuit 102 is not added, after staring the turn-off operation, the GCT element 101 begins to restore its voltage blocking characteristic, and begins to block the voltage. Then, the element voltage reaches a source voltage, and upon reaching the source voltage, the current flowing in the GCT element 101 begins to reduce. This means that the current continues to flow in the element until the element voltage reaches the source voltage, and turn-off loss of the GCT element itself increases by several tens of percent or more as compared with the case where the snubber circuit 102 is added.

To cope with this disadvantage, a GCT element has been proposed, in which turn-off loss is reduced without adding any snubber circuit, element voltage of the GCT element quickly reaches source voltage, and current can be quickly reduced.

FIG. 8 is a sectional view showing a conventional GCT element. FIG. 9 is a top view showing the conventional GCT element viewed from a cathode side. FIG. 8 shows a section taken along the line A—A in FIG. 9. In FIG. 8, numeral 111 is an $N^-$ region made of an $N^-$ semiconductor substrate containing impurities of a lower-concentration. The $N^-$ region 111 is comprised of two layers; one is a first layer 111a formed to be short in lifetime due to lattice defect therein, and the other is a second layer 111b formed to be locally close to an N region 112 in the $N^-$ region 111 and to be shorter in lifetime than the first layer 111a.

Numeral 112 is the N region made of an N-type semiconductor formed on the face of the second layer 111b side in the $N^-$ region 111. Numeral 113 is a circular-shaped or torus-shape P emitter region made of a P-type semiconductor, formed selectively on top of the N region 112. Numeral 114 is a P base region made of a P-type semiconductor formed on the face of the first layer 111a side in the $N^-$ region 111. Numeral 115 is N emitter region made of an N-type semiconductor, formed selectively on top of the P base region 114.

Numeral 116 is a cathode electrode made of a metal such as aluminum, formed on top of the N emitter region 115. Numeral 117 is a gate electrode formed on top of such areas of the P base region 114 where the N emitter region 115 is not formed. Numeral 118 is an anode electrode formed on top of the P emitter region 113 and also on top of the N region 112 that are estranged by the P emitter region 113. The P emitter region 113 and the N region 112 are short-circuited at the anode electrode 118 and form an anode short-circuit structure.

A top view from a cathode side of the element is shown in FIG. 9. The gate electrode 117 is formed on top of the P base region 114. In a radial pattern from the center of the gate electrode 117, four elliptical regions are formed selectively in the areas where the electrode 117 is not formed. In each of the elliptical regions, the N emitter region 115 is formed so as not to be in contact with the gate electrode 117, and the elliptical cathode electrode 116 is formed on top of the N emitter region 115.

FIG. 10 shows a distribution of lifetimes of the semiconductors in the $N^-$ region 111 shown in FIGS. 8 and 9. As shown in FIG. 10, in order to form the layers that have different lifetimes from each other, first, lattice defects are evenly formed in the $N^-$ region 111 by electron beam irradiation technique to shorten the lifetime. Then, comparatively heavy ions such as proton are implanted into the second layer 111b to produce a regional crystal imperfection in the area making consequently the lifetime of the second layer 111b shorter than that of the first layer 111a (i.e., the $N^-$ region 111 excluding the second layer 111b). In this manner, by forming the lattice defects therein, the lifetime of the first layer 111a in the $N^-$ region 111 is controlled to be within a range of 50 to 200 µs and that of the second layer 111b is controlled to be within a range of 1 to 100 µs, respectively.

Operation of the above mentioned conventional semiconductor device is hereinafter described.

The semiconductor device indicated in both FIG. 8 and FIG. 9 is arranged to be connected to the circuit without any snubber circuit, as shown in FIG. 7. When the turn-off operation is made under this condition, a depletion layer starts to be formed in a direction from the PN junction between the P base region 114 and the $N^-$ region 111 toward the anode side. Since the lifetime of the first layer 111a of the $N^-$ region 111 is formed shorter, the depletion layer is quickly formed in the area near the PN junction between the P base region 114 and the N⁻ region 111. Then, this depletion layer extends to the anode side and reaches the second layer 111b in the N⁻ region 111. At this point, since the lifetime of the second layer 111b is formed shorter than that of the first layer 111a, extension speed of the depletion layer is further accelerated in the second layer 111b. That is, residual carriers are quickly vanished. As a result, a tail electric current caused by the residual carriers can be reduced.

FIG. 11 shows a main electric current and a main electric voltage at a turn-off operation of the conventional semiconductor device. As shown in FIG. 11, with the decrease of the main current at the turn-off operation, extension speed of a depletion layer increases, and current dropping speed is increased. Consequently, with the increase of current dropping speed, a very high spike voltage is generated.

In order to further improve formation speed of a depletion layer at the initial stage of turn-off operation, a further semiconductor device is disclosed in the Japanese Patent Publication (unexamined) No. 235782/87. In this semiconductor device, an additional regional layer of a short lifetime is formed in the vicinity of a cathode electrode side in an N⁻ region of the semiconductor device.

In this manner, in any of the conventional semiconductor device, the lifetime of the N⁻ region is evenly shortened by means of electron beam irradiation technique so that the depletion layer is quickly formed at the turn-off operation. However, with the increase of turn-off current, the current dropping speed increases and the spike voltage is bound to become very high. Hence, a problem exists in that a high spike voltage exceeding a voltage blocking capacity of the element is applied, whereby a voltage breakdown arises.

Moreover, when the spike voltage becomes very high as mentioned above, momentary loss, at the time of generation of the spike voltage, becomes very high, and it is highly possible that the high momentary loss leads to a thermal breakdown. Hence, another problem exists in that in order to avoid the thermal breakdown, controllable current at the turn-off operation has to be restricted to a low level.

DISCLOSURE OF THE INVENTION

The present invention was made to resolve the above-discussed problems and has an object of providing a semiconductor devices capable of controlling spike voltage at the turn-off operation.

The object and advantages are achieved by providing a new and improved semiconductor device comprising a first region composed of a first conductor, a second region composed of a second conductor formed on top of the first region, a third region composed of the first conductor formed on top of the second region and a fourth region composed of the second conductor formed on top of the third region, the second region being comprised of a depletion-layer forming auxiliary layer having a short lifetime formed in the vicinity of the third region, a tail-current suppression layer having a shorter lifetime than that of the depletion-layer forming auxiliary layer and formed in the vicinity of the first region and a depletion-layer forming suppression layer having a longer lifetime than that of the depletion-layer forming auxiliary layer and formed between the depletion-layer forming auxiliary layer and the tail-current suppression layer.

As a result, at the stage before a spike voltage is generated, formation speed of the depletion layer being formed from the area in the vicinity of a PN junction at the turn-off operation can be suppressed, and a value of spike voltage can be kept small, eventually resulting in a made small turn-off loss.

It is preferable that the depletion-layer forming suppression layer is formed in such a manner that lifetime on the third region side is shorter than that on the first region side. In this case, in the depletion-layer forming suppression layer, extension of the depletion layer is suppressed in due order, and a value of spike voltage can be kept small.

It is also preferable that the depletion-layer forming suppression layer is formed in such a manner that lifetime becomes longer consecutively in due order in a direction from the third region side to the first region side. In this case, extension of the depletion layer can be slackened little by little and a spike voltage can be suppressed all the more.

It is also preferable that the lifetime of the depletion-layer forming suppression layer is in the range of 200 to 500 μs.

It is also preferable that thickness ratio of the depletion-layer forming suppression layer is in the range of 15 to 40 percent of the second region. In this case, the tail-current suppression layer can be wider, and after the spike voltage is generated, a tail current can be quickly suppressed.

It is also preferable that thickness ratio of the depletion-layer forming suppression layer is in the range of 40 to 65 percent of the second region. In this case, the depletion-layer forming suppression layer can be wider, and the spike voltage can be further suppressed.

It is also preferable that a depletion-layer forming promotion layer having a lifetime shorter than that on the second region side of the depletion-layer forming auxiliary layers is formed on the third region side of the depletion-layer forming auxiliary layer. In this case, formation speed of the depletion layer can be further increased, and di/dt (current dropping speed) at an initial stage of turn-off can be prevented from lowering.

It is also preferable that a peak-voltage suppression layer is formed between the tail-current suppression layer in the second region and the first region in order to suppress formation speed of a depletion layer and to suppress a peak voltage generated at a turn-off operation of the semiconductor device. In this case, extension speed of the depletion layer being formed fast in the tail-current suppression layer can be suppressed again, whereby a peak voltage of the main voltage can be suppressed.

BEST MODE OF CARRYING OUT THE INVENTION

The present invention is hereinafter described in more detail with reference to the accompanying drawing.

Figure 1:
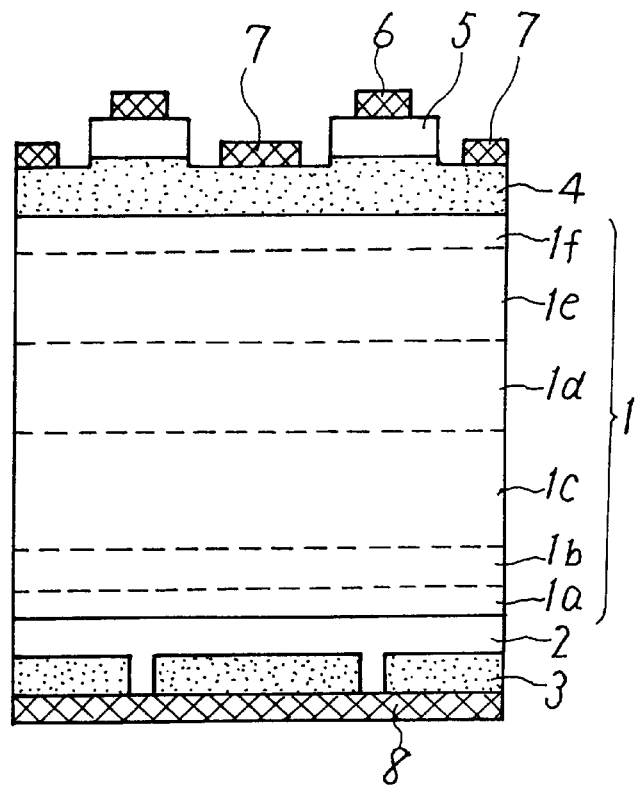
FIG. 1 is a section view showing a semiconductor device according to mode 1 of the present invention.
Figure 2:
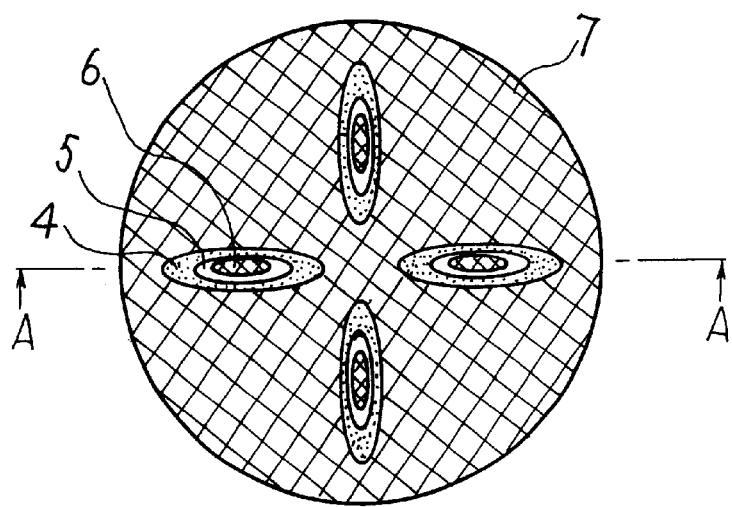
FIG. 2 is a top view showing the semiconductor device according to mode 1 of the invention.

Mode 1:

FIG. 1 shows a sectional view showing a semiconductor device according to mode 1 of the invention. FIG. 2 is a top view, seen from a cathode side, of the semiconductor device according to mode 1 of the invention. More specifically, FIG. 1 is a sectional view taken along the line A—A shown in FIG. 2. In the drawings, reference numeral 1 is an N⁻ region serving as a second region made of an N-type semiconductor substrate such as silicon and containing impurities of a low concentration. The N⁻ region is comprised of six layers whose lifetimes differ from one another and that are formed in such an order from an anode side as a first layer 1a, a second layer 1b, a third layer 1c, a fourth layer 1d, a fifth layer 1e and a sixth layer 1f.

In this respect, the third layer 1c and the fourth layer 1d form a depletion-layer forming suppression layer to suppress a spike voltage. These layers are formed to suppress formation speed of a depletion layer so that the spike voltage generated at the turn-off operation of the semiconductor device may be suppressed. The fifth layer 1e is formed to have a shorter lifetime than those of the depletion-layer forming suppression layer (the third layer 1c and the fourth layer 1d) in order to promote formation of the depletion-layer in its own area. The sixth layer 1f is a depletion-layer forming promotion layer, and is formed to have a shorter lifetime than that of the fifth layer 1e in order to promote formation of the depletion-layer further. In this manner, both fifth layer 1e and sixth layer 1f form a depletion-layer forming auxiliary layer. Then, the second layer 1b is a tail-current suppression layer formed in the vicinity of an N region 2 in order to suppress a tail current, and the first layer 1a is a peak-voltage suppression layer formed adjacent to the N region 2 in order to suppress peak current.

In this mode, each layer in the N⁻ region 1 is formed to have a following percentage: 5% for the first layer 1a, 10% for the second layer 1b, 25% for the third layer 1c, 25% for the fourth layer 1d, 30% for the fifth layer 1e and 5% for the sixth layer 1f. Percentage of each layer, however, is not limited to the percentages mentioned above, but is variable according to characteristics of elements such as lifetime. In general, it is satisfactory when thickness of each layer falls within the following range: 10 to 40 μm for the first layer 1a, 40 to 60 μm for the second layer 1b, 100 to 200 μm for the third layer 1c, 100 to 200 μm for the fourth layer 1d, 150 to 250 μm for the fifth layer 1e and 10 to 40 μm for the sixth layer 1f. It is preferable that thickness of the third layer 1c and the fourth layer 1d, serving as the depletion-layer forming suppression layer, occupies in the range of 40 to 60% of the N⁻ region 1.

Numeral 2 is the N region containing impurities of a higher concentration than that in the N⁻ region 1, and formed on one side of the N⁻ region 1. Numeral 3 is a P emitter region of a P-type semiconductor serving as a first region, and formed selectively on the opposite side of the N⁻ region 1, in the N region 2. Numeral 4 is a P base region of the P-type semiconductor serving as a third region, and formed on the other side of the N⁻ region 1. The numeral 5 is an N emitter region of an N-type semiconductor serving as a fourth region, and formed selectively on top of the P base region 4.

Numeral 6 is a cathode electrode made of metal or other materials formed on top of the N emitter region 5. Numeral 7 is a gate electrode formed to surround the N emitter region 5 on top of the P base region 4 where the N emitter region 5 is not formed. Numeral 8 is an anode electrode formed on top of the P emitter region 3 and also on top of the N region 2 of an estrangement region between the P emitter regions 3. The P emitter region 3 and the N region 2 are short-circuited at the anode electrode 8 and form an anode short-circuit structure.

On the cathode side, as shown in FIG. 2, the gate electrode 7 is formed on top of the P base region 4. In a radical pattern from the center of the gate electrode 7, four elliptical regions are formed selectively. The electrode 7 is not formed in the four elliptical regions. In each of elliptical regions, the N emitter region 5 placed without being in contact with the gate electrode 7 is formed, and the elliptical cathode electrode 6 is formed on top of the N emitter region 5. Although the four elliptical regions are formed in the areas, where the gate electrode 7 is not formed, selectively in a radial pattern from the center of the gate electrode 7, the structure is not limited to such an arrangement. It is preferable that plural elliptical region are formed in the same radial line otherwise in the opposite radial line.

Figure 3:
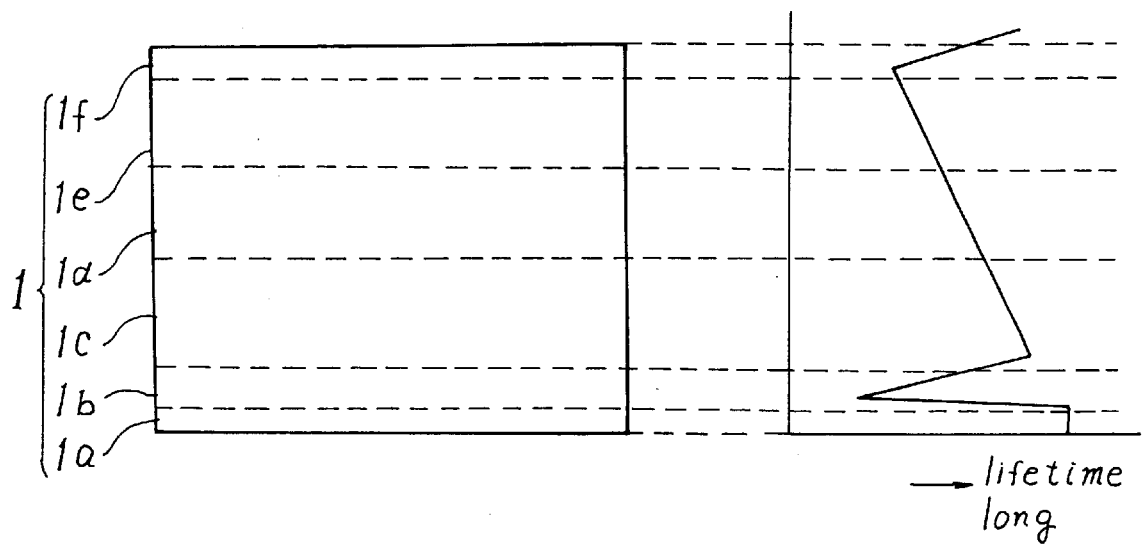
FIG. 3 is a diagram showing lifetime distribution of the semiconductor device according to mode 1 of the invention.

Then, distribution of lifetimes of the N⁻ region 1 in the semiconductor device shown in FIG. 1 and FIG. 2 are hereinafter described. FIG. 3 is a diagram showing lifetime distribution of each layer of the N⁻ region 1 in the semiconductor device shown in FIG. 1 and FIG. 2. As shown in FIG. 3, lifetime of the first layer 1a is formed to be the longest among the layers in the N⁻ region 1 and to be in the range of 300 to 800 μs. As a result, extension of the depletion layer formed in the first layer 1a can be suppressed at the turn-off operation, whereby the peak voltage can be suppressed.

Lifetime of the second layer 1b is formed to be the shortest among the layers in the N⁻ region 1 and to be in the range of 1 to 100 μs. As a result, extension of the depletion layer formed in the second layer 1b is promoted at the turn-off operation and the tail current generated at the turn-off operation can be suppressed to be low.

Each lifetime of the third layer 1c and the fourth layer 1d is formed to be longer than that of the fifth layer 1e. At the same time, lifetime of the third layer 1c and the fourth layer 1d are formed to be longer increasingly in order from the fourth layer 1d to the third layer 1c so that extension speed of the depletion layer formed in the layers may be suppressed. The lifetimes of the third layer 1c and the fourth layer 1d are respectively formed to be in the range of 200 to 500 μs and 100 to 300 μs.

Lifetime of the fifth layer 1e is formed shorter than that of the fourth layer 1d so that a depletion layer may extend quickly at the turn-off operation. Lifetime of the sixth layer 1f is formed shorter than that of the fifth layer 1e so that a depletion layer may be formed quickly and that di/dt (current dropping speed) at the initial stage of turn-off can be prevented from lowering. The lifetimes of the fifth layer 1e and the sixth layer 1f are respectively formed to be in a range of 50 to 200 μs and 10 to 150 μs.

In this manner, with each lifetime formed to be longer increasingly in order from the fifth layer 1e to the third layer 1c, extension speed of the depletion layer formed at each layer can be suppressed, and spike voltage generated at the same time can be suppressed.

In order to form the mentioned layers whose lifetimes differ from one another, comparatively heavy ions such as proton are irradiated from the anode side before the anode electrode 8 is formed. When those ions are irradiated into the semiconductor substrates, the ions stop at a certain range determined by accelerated energy. It is certain that a very small amount of crystal defects are formed also in the region where the ions have passed through, but a larger amount of crystal defects are increasingly formed as comes closer to the range. In other words, a considerable amount of crystal defects are partially formed in the area where the ions stop, whereby it is possible to make lifetime short partially in that region. Making use of such crystal-defects formation method, in which ions can be irradiated onto a specific range for a specific layer, the above-mentioned lifetime distribution can be formed in an desired manner.

In addition, through the process where lifetime of each layer is caused to increase or decrease consecutively and the lifetime of each layer is formed to be in a consecutive order, a depletion layer can be consecutively formed.

Although the lifetime of each layer is caused to increase or decrease consecutively, this arrangement is not restrictive. It is also preferable that increase or decrease takes place stepwise. Alternatively, a partial but sequential increase or decrease is also preferable.

Then, operation of the semiconductor device at the time of turn-off operation in FIG. 1 and FIG. 2 is hereinafter described.

Figure 4:
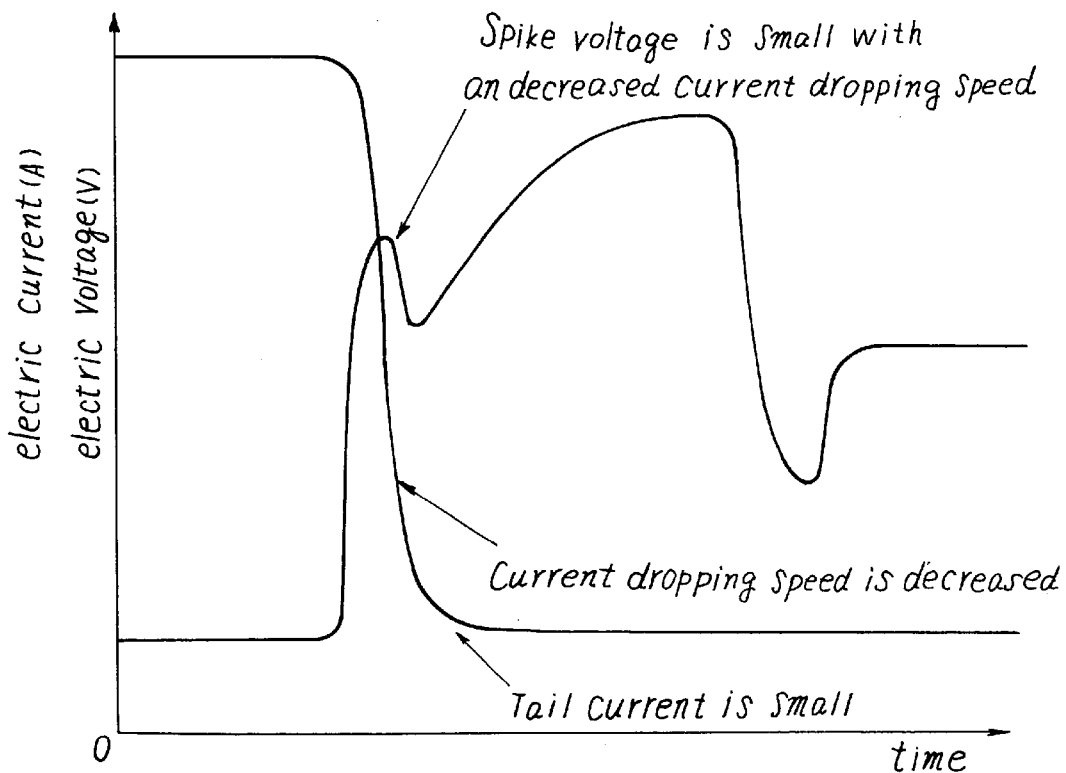
FIG. 4 is a graph showing a main current and a main voltage at a turn-off operation of a semiconductor device according to mode 1 of the invention.

FIG. 4 shows a main electric current and a main electric voltage in a turn-off operation of the semiconductor device shown in FIG. 1 and FIG. 2.

At the initial stage of the turn-off operation, due to residual carriers produced in ON state in the vicinity of the PN junction between the N⁻ region 1 and the P base region 4 and remaining there, depletion layer is difficult to be instantaneously formed. However, as the lifetime of the sixth layer 1f near the PN junction is formed short, the residual carriers in the sixth layer 1f near the PN junction start to vanish without delay, and the depletion layer starts to be quickly formed. Concurrently, the main current starts to reduce rapidly.

Then, the depletion layer that starts being formed extends to the fourth layer 1d through the fifth layer 1e. Since the lifetime of the fifth layer 1e is formed comparatively short so that the depletion layer can easily extend, the depletion layer quickly extends until it reaches the fourth layer 1d. At this time, the main voltage recovers in proportion to the extension of the depletion layer, and then the element voltage comes to reach the source voltage. When the element voltage becomes higher, the extension of the depletion layer reaches the fourth layer 1d and the third layer 1c that have longer lifetimes.

Thus, when the depletion layer extends and reaches the fourth layer 1d and the third layer 1c, a spike voltage arises due to a sharp drop of the main electric current. However, since the lifetimes in the fourth layer 1d and the third layer 1c are made longer than the preceding layer, or the fifth layer 1e, extension of the depletion layer is suppressed in the fourth layer 1d and the third layer 1c. Accordingly, as shown in FIG. 4, the current drop can be kept low and the spike voltage can be suppressed to be a satisfactorily lower value as compared with that of a conventional type.

Thereafter, the depletion layer extends to the second layer 1b and the first layer 1a. Since the second layer 1b is formed to have the shortest lifetime in the N⁻ region, extension speed of the depletion layer can be increased after the spike voltage arises, then, a tail current can be suppressed low.

Furthermore, as the lifetime of the first layer 1a is made to be the longest in the N⁻ region 1, extension of the depletion layer can be suppressed again so that a peak voltage of the main electric voltage can be suppressed.

In this mode, the lifetimes of the third layer and the fourth layer, serving as the depletion-layer forming suppression layer, are formed longer than that of the fifth layer that is formed between the third and fourth layers and the P base region. Therefore, the value of the spike voltage at the turn-off operation can be suppressed low. Consequently, not only the turn-off loss can be reduced but also a highly controllable current can be applied.

Further, the lifetimes in the depletion-layer forming suppression layer are formed to be longer consecutively in an order from the cathode side to the anode side. Therefore, extension of the depletion layer can be gradually slackened and the spike voltage can be suppressed further.

Further, the sixth layer serving as the depletion-layer forming promotion layer, whose lifetime is shorter than that of the fifth layer, is formed between the fifth layer and the P base region. Therefore, formation of the depletion-layer can be accelerated, di/dt (current dropping speed) at the initial stage of turn-off can be prevented form lowering, and the time for the element voltage to reaches the source voltage can be shortened further. As a result, the turn-off loss can be reduced all the more.

Further, the second layer serving as the tail-current suppression layer, whose lifetime is the shortest, is formed between the third layer and the N region. Therefore, extension speed of the depletion layer, that is once slackened, can be increased and the tail current can be suppressed.

Furthermore, the peak-voltage suppression layer is formed to suppress the peak voltage, between the third layer serving as the tail-current suppression layer and the N region. Therefore, extension speed of the depletion layer, once increased in the tail-current suppression layer, can be suppressed again and the peak voltage value of the main electric voltage can be suppressed.

Mode 2:

A semiconductor device according to mode 2 of the invention is a modification of the semiconductor device according to the foregoing mode 1 and is different in the aspect of lifetime distribution in the N⁻ region of the semiconductor device shown in FIG. 1 and FIG. 2.

Figure 5:
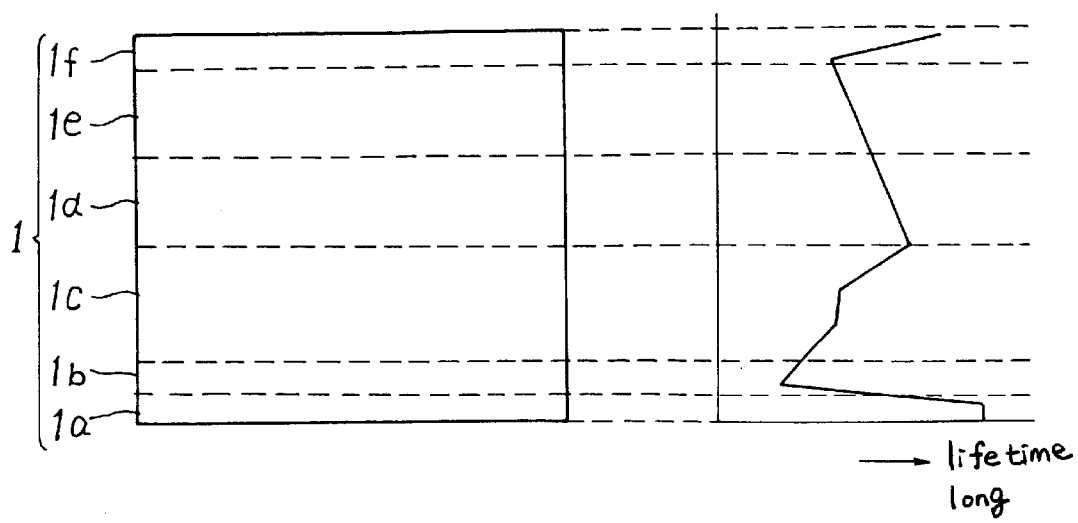
FIG. 5 is a diagram showing lifetime distribution of the semiconductor device according to mode 2 of the invention.
Figure 6:
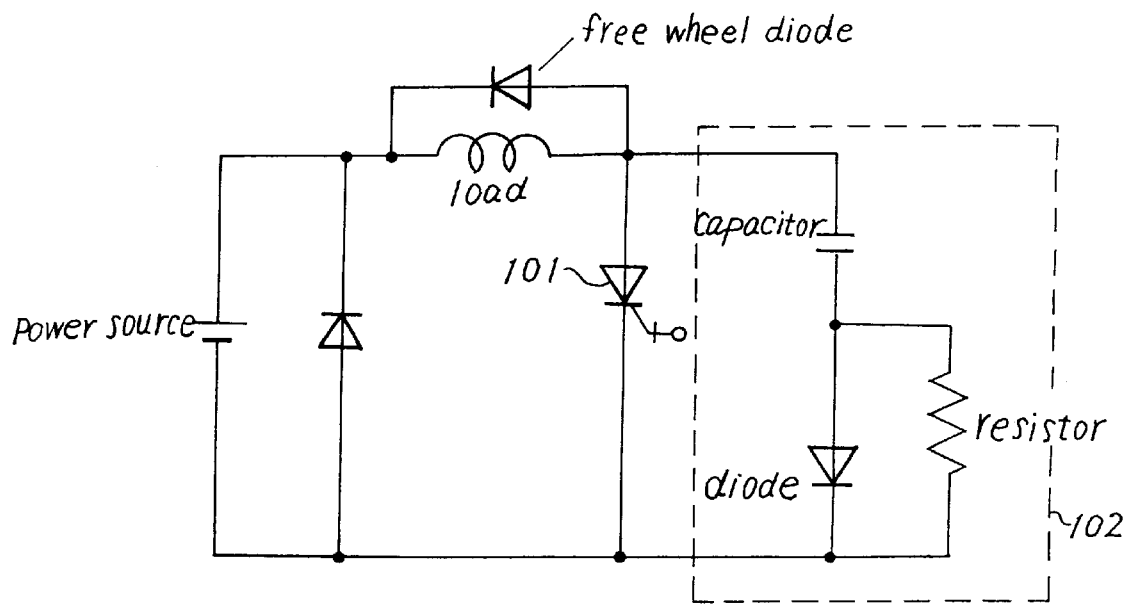
FIG. 6 is a circuit diagram applicable to a semiconductor device when a snubber circuit is added.
Figure 7:
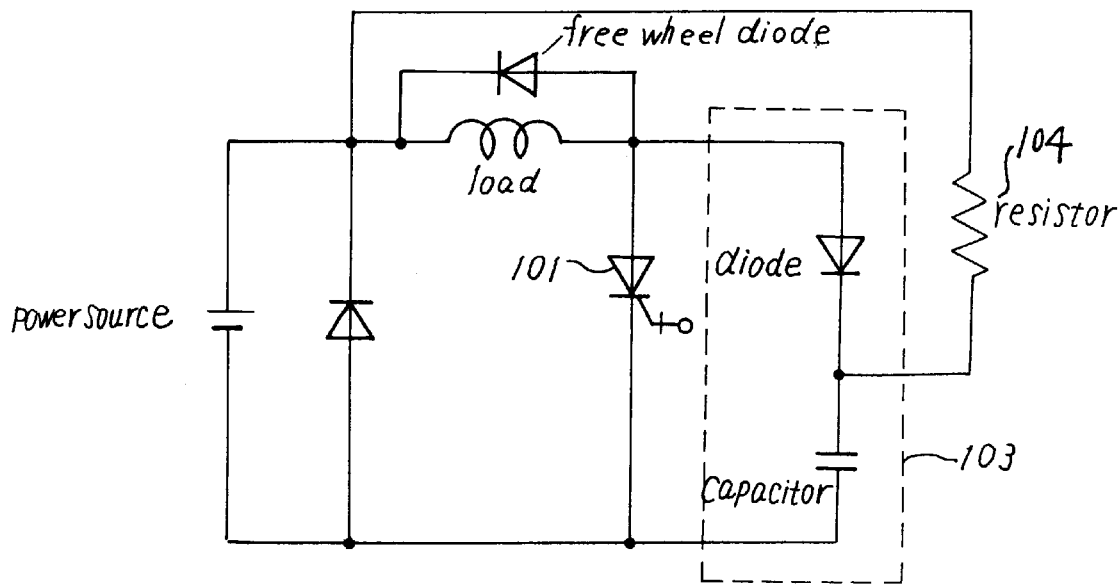
FIG. 7 is a circuit diagram applicable to a semiconductor device when a snubber circuit is not added.
Figure 8:
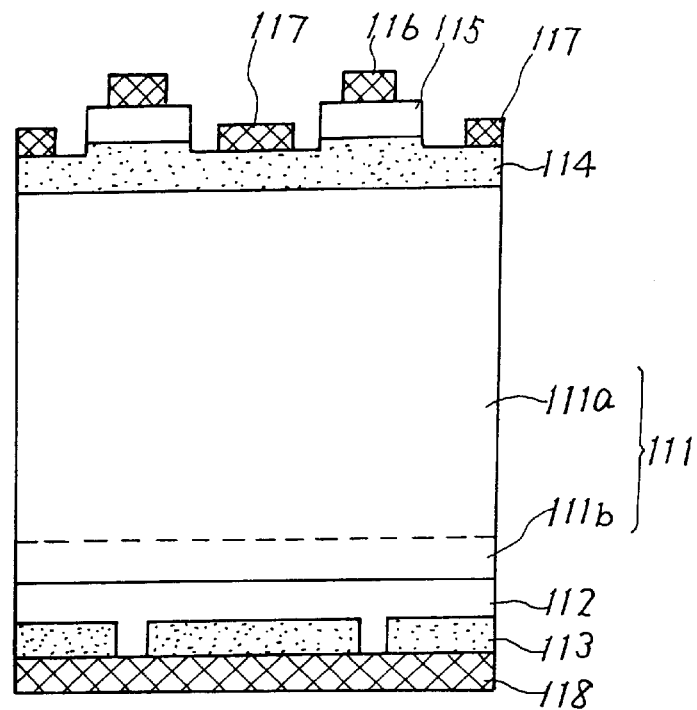
FIG. 8 is a section view of a conventional semiconductor device.
Figure 9:
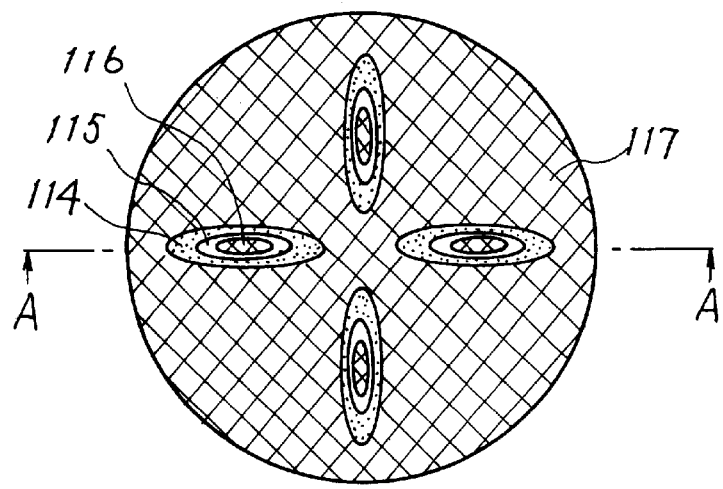
FIG. 9 is a top view of the conventional semiconductor device.
Figure 10:
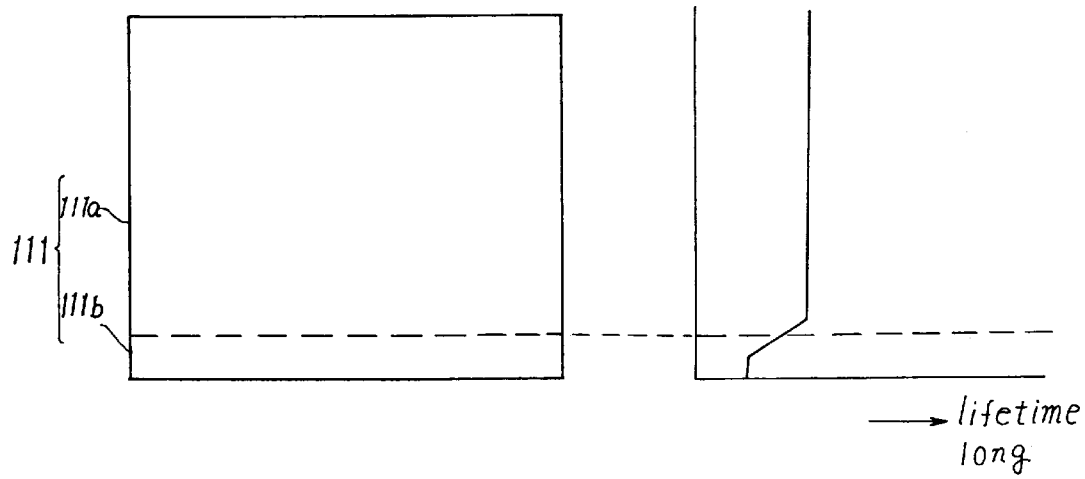
FIG. 10 is a diagram showing lifetime distribution of the conventional semiconductor device.
Figure 11:
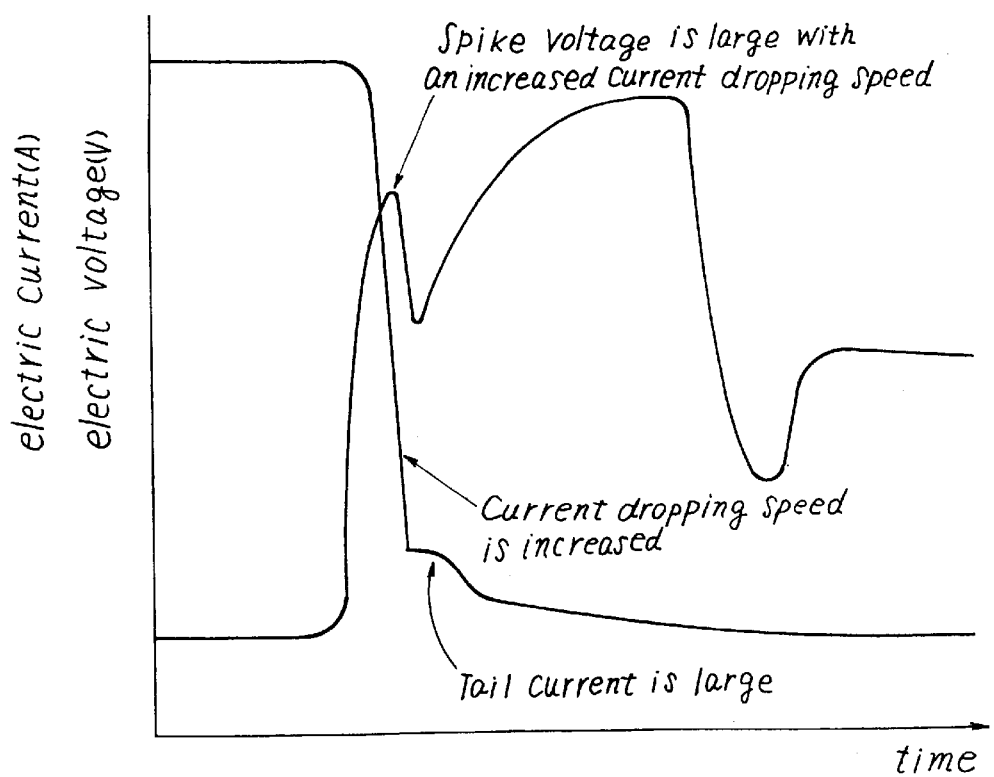
FIG. 11 is a graph showing a main current and a main voltage at the turn-off operation of a conventional semiconductor device.

FIG. 5 shows lifetime distribution in an N⁻ region of the semiconductor device according to mode 2 of the invention. Lifetimes of layers are the same as those in the foregoing mode 1 shown in FIG. 3, except a third layer 1c, and a further description is omitted herein. As shown in FIG. 5, lifetime of the third layer 1c is formed longer than that of a second layer 1b but shorter than that of a fourth layer 1d so that extension speed of a depletion layer formed in this layer is increased. The lifetime of the third layer 1c in this mode 2 is formed to be in the range of 50 to 200 $\mu$s. It is preferable that thickness ratio of the fourth layer 1d serving as a depletion-layer forming suppression layer, is in the range of 15 to 40% of the N⁻ region.

The lifetime distribution shown in FIG. 3 shows that the depletion-layer forming suppression layer continues up to the third layer 1c, and the lifetime becomes sharply shorter in the second layer 1b from that in the third layer 1c. On the other hand, the lifetime distribution shown in FIG. 5 shows that only the fourth layer 1d serves as the depletion-layer forming suppression layer, and extension speed of the depletion layer is gradually increased over the long range from the fourth layer 1d to the second layer 1b. Consequently, a tail current can be suppressed further.

In the case of this mode 2, when controlling the lifetime of each layer in such a manner that the spike voltage is generated at the time the depletion layer is formed in the fourth layer 1d, suppression of the tail current can be improved, irrespective of capability of suppressing the spike voltage.

In this mode, the lifetime of the fourth layer serving as the depletion-layer forming suppression layer is longer than that of a fifth layer formed between the fourth layer and a P base region. Therefore, value of the spike voltage generated at the turn-off operation can be suppressed low, and not only a highly controllable current is made applicable but also turn-off loss can be made smaller.

Furthermore, as the lifetime of the third layer is formed longer than that of the second layer but shorter than that of the fourth, extension speed of the depletion layer can be increased and the tail current can be suppressed further.

As has been described so far, the semiconductor device according to the present invention is applicable to a semiconductor device for a large amount of electric power such as GCT element dealing with a high pressure and a large amount of current without any snubber circuit.

What is claimed is:

1. The semiconductor device comprising:
a first region having a first conductivity type;
a second region having a second conductivity type, said second region being formed on top of said first region;
a third region having said first conductivity type, said third region being formed on
top of said second region; and
a fourth region having said second conductivity type, said fourth region being formed on top of said third region;
said second region being comprised of a depletion-layer forming auxiliary layer having a short lifetime and formed in the vicinity of said third region; a tail-current suppression layer having a shorter lifetime than that of said depletion-layer forming auxiliary layer and formed in the vicinity of said first region; and a depletion-layer forming suppression layer having a longer lifetime than that of said depletion-layer forming auxiliary layer and formed between said depletion-layer forming auxiliary layer and said tail-current suppression layer,
wherein lifetime of said depletion-layer forming suppression layer is formed in such a manner that lifetime on said third region side is shorter than that on said first region side.

2. The semiconductor device as set forth in claim 1, wherein said depletion-layer forming suppression layer is formed in such a manner that lifetime becomes longer consecutively in due order from said third region side to said first region side.

3. The semiconductor device as set forth in claim 1, wherein the lifetime of said depletion-layer forming suppression layer is in the range of 200 to 500 µs.

4. The semiconductor device as set forth in claim 1, wherein a thickness ratio of the depletion-layer forming suppression layer is in the range of 15 to 40 percent of said second region.

5. The semiconductor device as set forth in claim 1, wherein a thickness ratio of the said depletion-layer forming suppression layer is in the range of 40 to 65 percent of said second region.

6. The semiconductor device as set forth in claim 1, wherein said depletion-layer forming auxiliary layer comprises:
a first depletion-layer forming promotion layer formed next to said depletion-layer forming suppression layer and having a lifetime shorter than that of said depletion-layer forming suppression layer, and
a second depletion-layer forming promotion layer formed next to said first depletion-layer forming promotion layer and having a lifetime shorter than that of said first depletion-layer forming promotion layer.

7. The semiconductor device comprising:
a first region having a first conductivity type;
a second region having a second conductivity type, said second region being formed on top of said first region;
a third region having said first conductivity type, said third region being formed on top of said second region; and
a fourth region having said second conductivity type, said fourth region being formed on top of said third region;
said second region being comprised of a depletion-layer forming auxiliary layer having a short lifetime and formed in the vicinity of said third region; a tail-current suppression layer having a shorter lifetime than that of said depletion-layer forming auxiliary layer and formed in the vicinity of said first region; and a depletion-layer forming suppression layer having a longer lifetime than that of said depletion-layer forming auxiliary layer and formed between said depletion-layer forming auxiliary layer and said tail-current suppression layer,
a peak-voltage suppression layer formed between said tail-current suppression layer in said second region and said first region, said peak-voltage suppression layer having a lifetime longer than that of any other layer in said second region.

8. The semiconductor device as set forth in claim 7, wherein the lifetime of said depletion-layer forming suppression layer is in the range of 200 to 500 µs.

9. The semiconductor device as set forth in claim 7, wherein a thickness ratio of the depletion-layer forming suppression layer is in the range of 15 to 40 percent of said second region.

10. The semiconductor device as set forth in claim 7, wherein a thickness ratio of the said depletion-layer forming suppression layer is in the range of 40 to 65 percent of said second region.

11. The semiconductor device as set forth in claim 7, wherein said depletion-layer forming auxiliary layer comprises:
a first depletion-layer forming promotion layer formed next to said depletion-layer forming suppression layer and having a lifetime shorter than that of said depletion-layer forming suppression layer, and
a second depletion-layer forming promotion layer formed next to said first depletion-layer depletion-layer forming promotion layer and having a lifetime shorter than that of said first depletion-layer forming promotion layer.

* * * * *